United States Patent
Yoon et al.

(10) Patent No.: US 7,868,316 B2
(45) Date of Patent: Jan. 11, 2011

(54) NITRIDE SEMICONDUCTOR DEVICE

(75) Inventors: Suk Ho Yoon, Seoul (KR); Ki Ho Park, Suwon (KR); Joong Kon Son, Seoul (KR)

(73) Assignee: Samsung Electro-Mechanics Co., Ltd, Suwon (KR)

( * ) Notice: Subject to any disclaimer, the term of this patent is extended or adjusted under 35 U.S.C. 154(b) by 71 days.

(21) Appl. No.: 12/350,188

(22) Filed: Jan. 7, 2009

(65) Prior Publication Data

US 2010/0117061 A1 May 13, 2010

(30) Foreign Application Priority Data

Nov. 7, 2008 (KR) ...................... 10-2008-0110647

(51) Int. Cl.
*H01L 33/06* (2010.01)

(52) U.S. Cl. .................. 257/15; 257/14; 257/E33.008; 257/E33.012; 257/E33.025; 257/E33.026; 257/E33.034

(58) Field of Classification Search ............. 257/14–15, 257/22, E33.008, E33.012, E33.023–E33.028, 257/E33.031–E33.034

See application file for complete search history.

(56) References Cited

U.S. PATENT DOCUMENTS

| | | | | |
|---|---|---|---|---|
| 4,695,857 A | * | 9/1987 | Baba et al. | 257/22 |
| 4,792,832 A | * | 12/1988 | Baba et al. | 257/22 |
| 4,882,609 A | * | 11/1989 | Schubert et al. | 257/194 |
| 5,693,958 A | * | 12/1997 | Torihara et al. | 257/59 |
| 5,747,827 A | * | 5/1998 | Duggan et al. | 257/15 |
| 5,851,905 A | * | 12/1998 | McIntosh et al. | 438/492 |
| 6,455,870 B1 | * | 9/2002 | Wang et al. | 257/12 |
| 7,705,364 B2 | * | 4/2010 | Lee et al. | 257/96 |
| 2001/0002048 A1 | * | 5/2001 | Koike et al. | 257/80 |
| 2007/0170459 A1 | | 7/2007 | Kyono et al. | |

FOREIGN PATENT DOCUMENTS

KR  10-2008-0010136  1/2008

* cited by examiner

*Primary Examiner*—A. Sefer
*Assistant Examiner*—Allen L Parker
(74) *Attorney, Agent, or Firm*—McDermott Will & Emery LLP

(57) ABSTRACT

There is provided a nitride semiconductor device. A nitride semiconductor device according to an aspect of the invention may include: an n-type nitride semiconductor layer; a p-type nitride semiconductor layer; an active layer provided between the n-type and p-type nitride semiconductor layers and having quantum well layers and quantum barrier layers alternately stacked on each other; and an electron blocking layer provided between the active layer and the p-type nitride semiconductor layer, and having a plurality of first nitride layers formed of a material having a higher band gap energy than the quantum barrier layers and a plurality of second nitride layers formed of a material having a lower band gap energy than the first nitride layers, the first and second nitride layers alternately stacked on each other to form a stacked structure, wherein the plurality of first nitride layers have energy levels bent at predetermined inclinations, and with greater proximity to the p-type nitride semiconductor layer, the first nitride layers have a smaller inclination of the energy level.

12 Claims, 8 Drawing Sheets

NITRIDE SEMICONDUCTOR DEVICE

CROSS-REFERENCE TO RELATED APPLICATIONS

This application claims the priority of Korean Patent Application No. 2008-0110647 filed on Nov. 7, 2008, in the Korean Intellectual Property Office, the disclosure of which is incorporated herein by reference.

BACKGROUND OF THE INVENTION

1. Field of the Invention

The present invention relates to nitride semiconductor devices that are used in light emitting diodes (LEDs).

2. Description of the Related Art

In general, nitride semiconductor devices have been widely used in green or blue light emitting diodes (LEDs) or laser diodes (LDs) that are provided as light sources in full color displays, image scanners, various kinds of signal systems, and optical communication devices. The nitride semiconductor device can be provided as a light emitting device having an active layer that emits light of various colors including blue and green by recombination of electrons and holes.

Since the development of the nitride semiconductor devices, the technological advancements have been made to expand the utilization of the nitride semiconductor devices. Research has also been made on the nitride semiconductor devices as general lighting and vehicle light source. Particularly, in the related art, the nitride semiconductor device has been used as a component that is applied to a low power, low current mobile product. Recently, the use of the nitride semiconductor device has been gradually expanded to high power high current products.

FIG. 1 is a cross-sectional view illustrating a general nitride semiconductor device. Referring to FIG. 1, a general nitride semiconductor layer 10 includes a substrate 11, an n-type nitride semiconductor layer 12, an active layer 13, and a p-type nitride semiconductor layer 15. An electronic blocking layer 14 is formed between the active layer 13 and the p-type nitride semiconductor layer 15. A p-type electrode 16b is formed on an upper surface of the mesa-etched p-type nitride semiconductor layer 15. An n-type electrode 16a is formed on an upper surface of the exposed n-type nitride semiconductor layer 12. The electron blocking layer 14 prevents electrons having higher mobility than holes from overflowing into the p-type nitride semiconductor layer 15, thereby increasing recombination efficiency of the electrons and carriers within the active layer 13. The electron blocking layer 14 can also serve as a barrier against the holes as well as the electrons. Therefore, the concentration of the holes passing the electron blocking layer 14 and entering the active layer 13 is reduced to increase an operating voltage.

SUMMARY OF THE INVENTION

An aspect of the present invention provides a nitride semiconductor device that can increase luminous efficiency and reduce an operating voltage by minimizing the entire difference in energy level of an electron blocking layer to reduce the influence caused by polarization.

According to an aspect of the present invention, there is provided a nitride semiconductor device including: an n-type nitride semiconductor layer; a p-type nitride semiconductor layer; an active layer provided between the n-type and p-type nitride semiconductor layers and having quantum well layers and quantum barrier layers alternately stacked on each other; and an electron blocking layer provided between the active layer and the p-type nitride semiconductor layer, and having a plurality of first nitride layers formed of a material having a higher band gap energy than the quantum barrier layers and a plurality of second nitride layers formed of a material having a lower band gap energy than the first nitride layers, the first and second nitride layers alternately stacked on each other to form a stacked structure, wherein the plurality of first nitride layers have energy levels bent at predetermined inclinations, and with greater proximity to the p-type nitride semiconductor layer, the first nitride layers have a smaller inclination of the energy level.

The plurality of first nitride layers may have the same band gap energy.

With greater proximity to the p-type nitride semiconductor layer, the plurality of first nitride layers may have a smaller difference in net polarization charge amount from the corresponding second nitride layers adjacent thereto, respectively.

The first nitride layer may include a composition expressed by $Al_xIn_yGa_{(1-x-y)}N$ (where $0 \leq x \leq 1$, $0 \leq y \leq 1$, and $0 \leq x+y \leq 1$).

With greater proximity to the p-type nitride semiconductor layer, the plurality of first nitride layers may have a higher aluminum and indium content.

With greater proximity to the p-type nitride semiconductor layer, the plurality of first nitride layers may have a greater energy level on the basis of a conduction band.

With greater proximity to the p-type nitride semiconductor layer, the first nitride layers may have a lower energy level.

With greater proximity to the p-type nitride semiconductor layer, the plurality of first nitride layers have a smaller difference in net polarization charge amount from the corresponding second nitride layers adjacent thereto, respectively.

The second nitride layers may have the same band gap energy as the quantum barrier layers.

The stacked structure having the first and second nitride layers alternately stacked on each other may be a super lattice structure.

The second nitride layer may include at least two different areas varying in energy level.

At least two of the plurality of first nitride layers may include the same inclination of the energy level, and the first nitride layers having the same inclination of the energy level may be arranged adjacent to each other.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
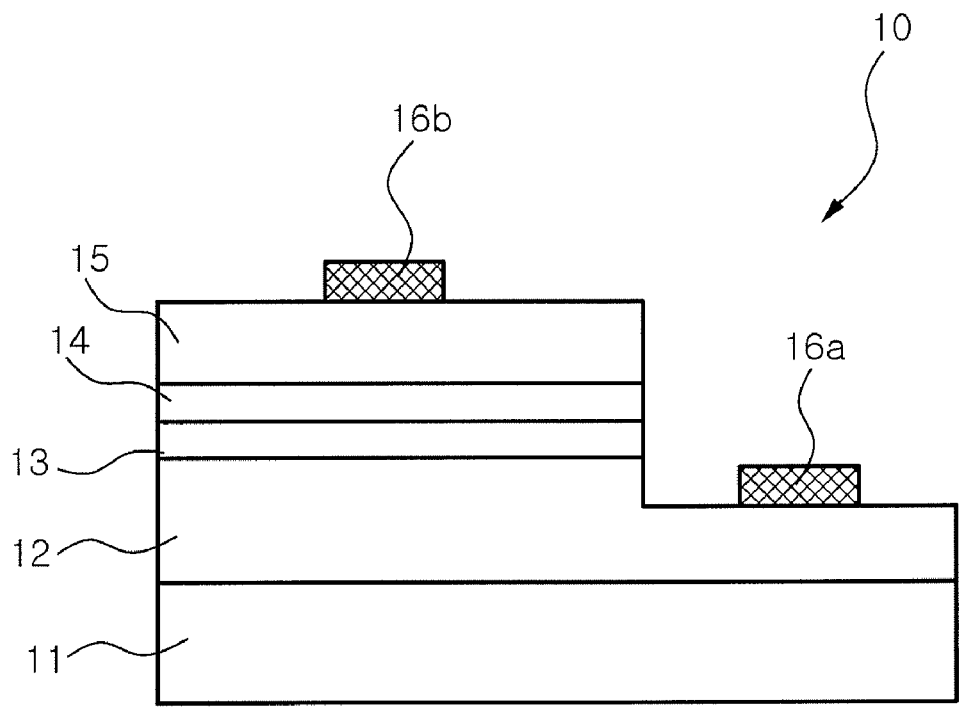
FIG. 1 is a cross-sectional view illustrating a general nitride semiconductor device according to the related art.

Exemplary embodiments of the present invention will now be described in detail with reference to the accompanying drawings.

The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

Figure 2:
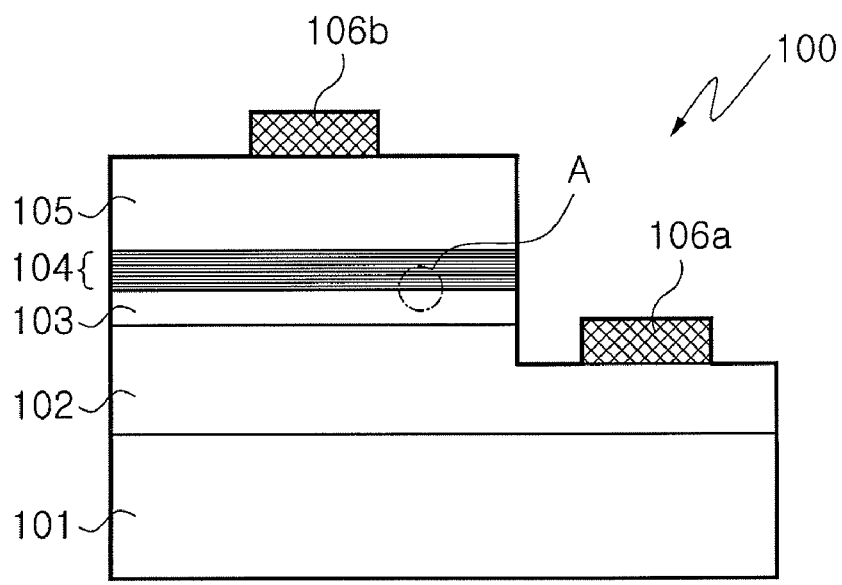
FIG. 2 is a cross-sectional view illustrating a nitride semiconductor device according to an exemplary embodiment of the present invention.
Figure 3:
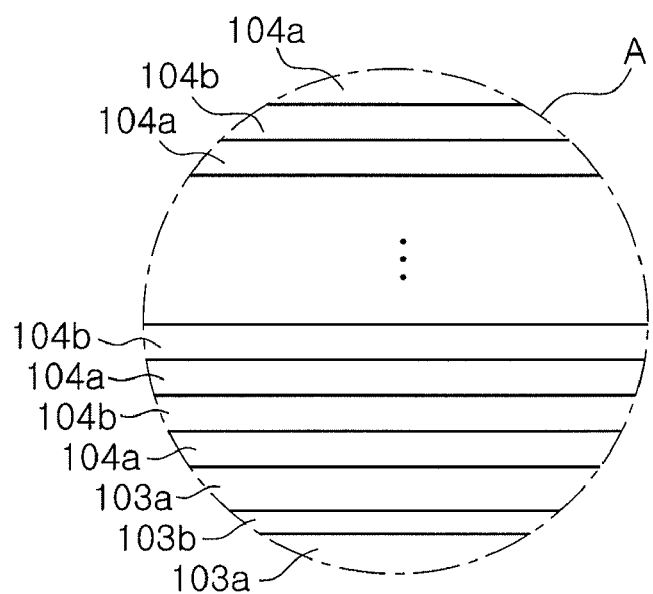
FIG. 3 is an enlarged view illustrating an area indicated by A in FIG. 2.
Figure 4:
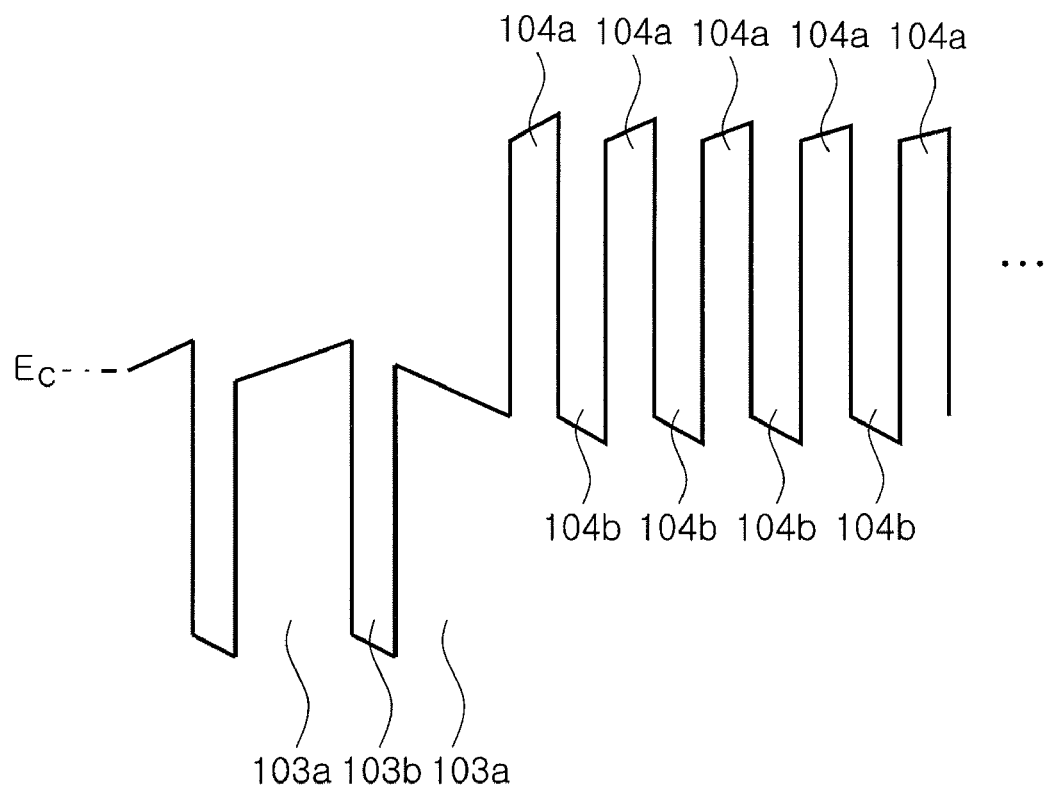
FIG. 4 is a schematic view illustrating conduction band energy levels of the area shown in FIG. 3.

FIG. 2 is a cross-sectional view illustrating a nitride semiconductor device according to an exemplary embodiment of the invention. FIG. 3 is an enlarged view illustrating an area indicated by A in FIG. 2. FIG. 4 is a schematic view illustrating conduction band energy levels of the area, shown in FIG. 3.

Referring to FIG. 2, a nitride semiconductor device 100 according to an exemplary embodiment of the invention includes a substrate 101, an n-type nitride semiconductor layer 102, an active layer 103, an electron blocking layer 104, and a p-type nitride semiconductor layer 105. An n-type electrode 106a is formed on an exposed surface of the n-type nitride semiconductor layer 102. A p-type electrode 106b may be formed on an upper surface of the p-type nitride semiconductor layer 105. Though not shown, an ohmic contact layer formed of a transparent electrode material may be formed between the p-type nitride semiconductor layer 105 and the p-type electrode 106b. In this embodiment, a horizontal nitride semiconductor device having the n-type and p-type electrodes 106a and 106b arranged in the same direction is exemplified. However, the invention is not limited thereto, but can be applied to a vertical nitride semiconductor device (here, a sapphire substrate may be removed), which can be easily understood by a person skilled in the art.

The substrate 101 is provided for nitride single crystal growth. In general, a sapphire substrate may be used. The sapphire substrate is formed of a crystal having Hexa-Rhombo R3c symmetry, and has a lattice constant of 13.001 Å along the c-axis and a lattice constant of 4.758 Å along the a-axis. Orientation planes of the sapphire substrate include the c(0001)plane, the a(1120)plane, and the r(1102)plane. The sapphire substrate 100 is widely used as a nitride single crystal growth substrate since a nitride thin film is relatively easily grown at the c-plane, and is stable at high temperature. A substrate formed of, for example, SiC, GaN, ZnO, $MgAl_2O_4$, MgO, $LiAlO_2$ and $LiGaO_2$ can be used according to the form. Further, a buffer layer, for example, an undoped GaN layer may be grown to improve crystal quality of the nitride semiconductor single crystal grown on the substrate 101.

The n-type and p-type nitride semiconductor layers 102 and 105 may be formed of semiconductor materials doped with n-type and p-type impurities having a composition expressed by $Al_xIn_yGa_{(1-x-y)}N$ (here, $0 \leq x \leq 1$, $0 \leq y \leq 1$, and $0 \leq x+y \leq 1$). Examples of the semiconductor materials may include GaN, AlGaN, and InGaN. Examples of the n-type impurity may include Si, Ge, Se, and Te. Examples of the p-type impurity may include Mg, Zn, and Be. The n-type and p-type nitride semiconductor layers 102 and 105 may be grown by using MOCVD or HVPE known in the art.

The active layer 103 formed between the n-type and p-type nitride semiconductor layers 102 and 105 emits light having predetermined energy by recombination between electrons and holes. The active layer 103 may have a composition expressed by $In_xGa_{1-x}N$ ($0 \leq x \leq 1$). The band gap energy is determined according to the indium content. As shown in FIG. 3, the active layer 103 may have a multiple quantum well (MQW) structure in which the quantum barrier layers 103a and the quantum well layers 103b alternately stacked on each other.

The electron blocking layer 104 blocks electrons having relatively high mobility, as compared to holes, from passing the active layer 103 and overflowing. In this embodiment, as shown in FIG. 3, the electron blocking layer 104 may have a super lattice structure in which the first nitride layers 104a and the second nitride layers 104b are alternately stacked on each another. The first nitride layer 104a has a higher energy level than the second nitride layer 104b. The second nitride layer 104b is formed of, for example, GaN, and has the same band gap energy as the quantum barrier layer 103a. Since the first and second nitride layers 104a and 104b are formed of different materials from each other, the energy level of each of the first and second nitride layers 104a and 104b have an inclination due to polarization.

Specifically, the nitride semiconductor layer grown on the c-plane of the sapphire, which is a polar plane, has spontaneous polarization because of structural asymmetry (lattice constant $a \neq c$) and iconicity of the nitride semiconductor. When nitride semiconductor layers having different lattice constants are sequentially stacked, piezoelectric polarization occurs due to strain formed on the semiconductor layer. Here, two kinds of polarizations are added to obtain net polarization. Net polarization charges are generated at each of the interfaces due to the net polarization to bend the energy levels. That is, the energy levels have an inclination. These bent energy levels make wave functions of the electrons and holes spatially inconsistent with each other within the active layer, and causes a reduction in electron blocking efficiency of the electron blocking layer.

In this embodiment, the inclinations of the energy level the first nitride layers 104a are reduced toward the p-type nitride semiconductor layer 105. That is, the closer the first nitride layers 104a are to the p-type nitride semiconductor layer 105, the smaller inclination of the energy level the first nitride layers 104a have. The entire polarization charge of the electron blocking layer 104 is the sum of polarization charges at the interfaces between the first and second nitride layers 104a and 104b. By reducing the energy level inclination of the first nitride layer 104a, the difference in energy level of the entire electron blocking layer 104 is reduced to thereby reduce the influence caused by the polarization. Here, the influence caused by the polarization may be reduced by directly decreasing the energy levels of the first nitride layers 104a, which causes an increase in leakage current. As a result, the luminous efficiency is also reduced. Therefore, a method of controlling the energy level inclination is more preferred like the invention of this application.

Figure 5:
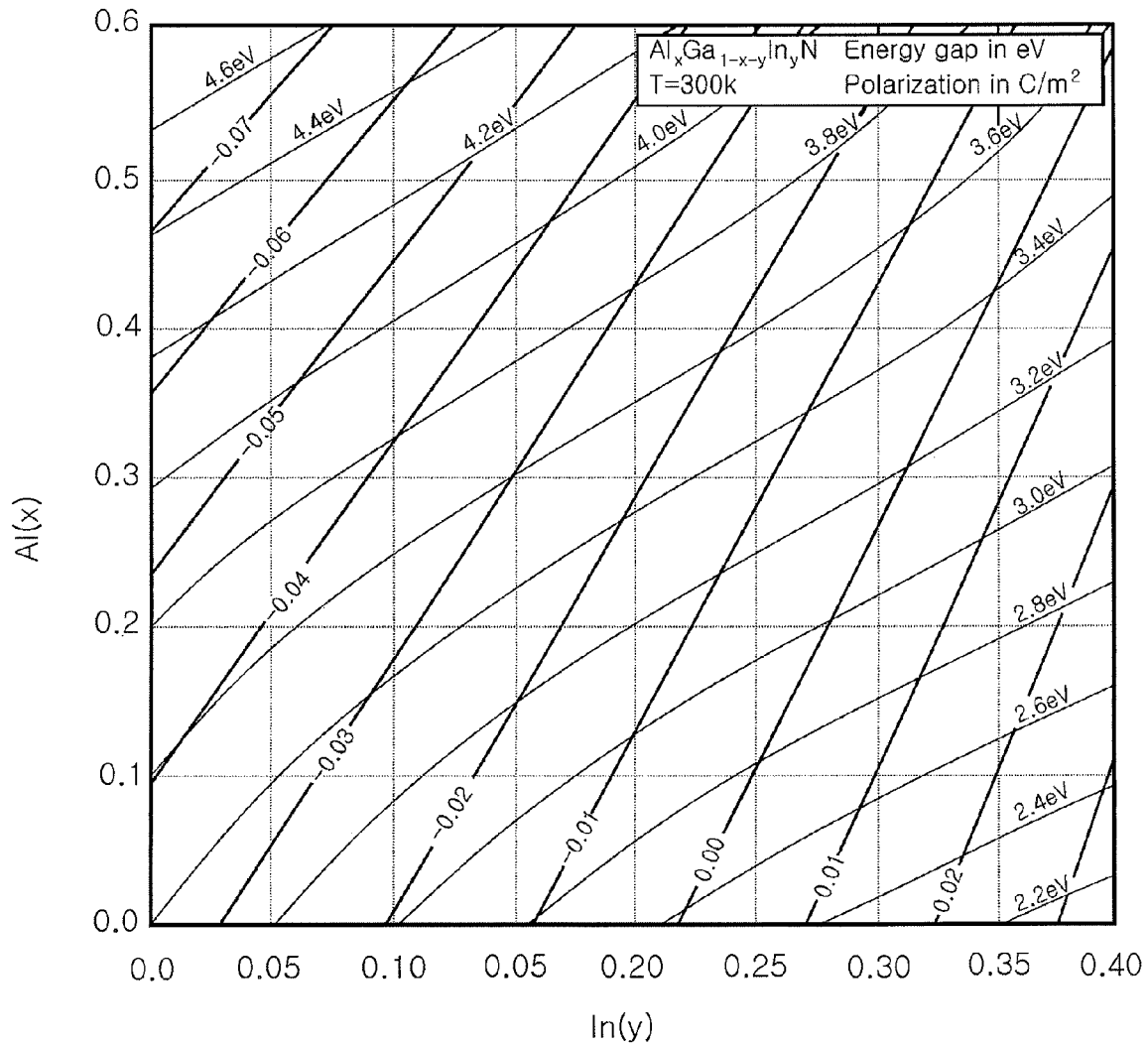
FIG. 5 is a view showing variations in band gap energy and net polarization charge amount according to the composition of aluminum and indium in an AlInGaN quaternary semiconductor.

Even though the first nitride layers 104a have different energy level inclinations from each other, the first nitride layers 104a may have the same energy level. Here, the magnitude of the energy level having the inclination may be defined as an intermediate value or a mean value. In order that the energy levels of the first nitride layers 104a are maintained at a predetermined level and at the same time, the inclinations of the energy levels are varied, each of the first nitride layers 104a needs to be formed of AlInGaN, which is a quaternary material, and a composition thereof needs to be appropriately controlled. This will be described with reference to FIG. 5. In FIG. 5, variations in band gap energy and net polarization charge amount according to the composition of aluminum and indium in an AlInGaN quaternary semiconductor are shown.

Referring to FIG. 5, the band gap energy and the net polarization charge amount of the nitride semiconductor having a composition expressed as $Al_xIn_yGa_{(1-x-y)}N$ (here, $0 \leq x \leq 1$, $0 \leq y \leq 1$, and $0 \leq x+y \leq 1$) can be controlled by the aluminum and the indium content. Here, as the aluminum content increases, the band gap energy increases, and the net polarization charge amount decreases (an absolute value increases). The indium content shows the opposite. Since the band gap energy and the net polarization charge amount vary according to the aluminum and indium content while having different inclinations from each other, the inclination of the energy level can be reduced by appropriately controlling the composition while the band gap energy is similar or equal to that in the related art.

Specifically, the inclination of the energy level may be reduced when there is a smaller difference in net polarization charge amount between different kinds of layers in contact with each other. Therefore, the energy level in this embodiment can be obtained by gradually varying the composition of the first nitride layer 104a, for example, by gradually increasing the aluminum content and the indium content of the first nitride layers 104a toward the p-type nitride semiconductor layer 105. As such, the band gap energy of the electron blocking layer used in this embodiment remains about the same as that of the general AlGaN electron blocking layer in the related art, and the difference in net polarization charge amount between the electron blocking layer and GaN is reduced to thereby reduce the influence caused by the polarization.

Figure 6:
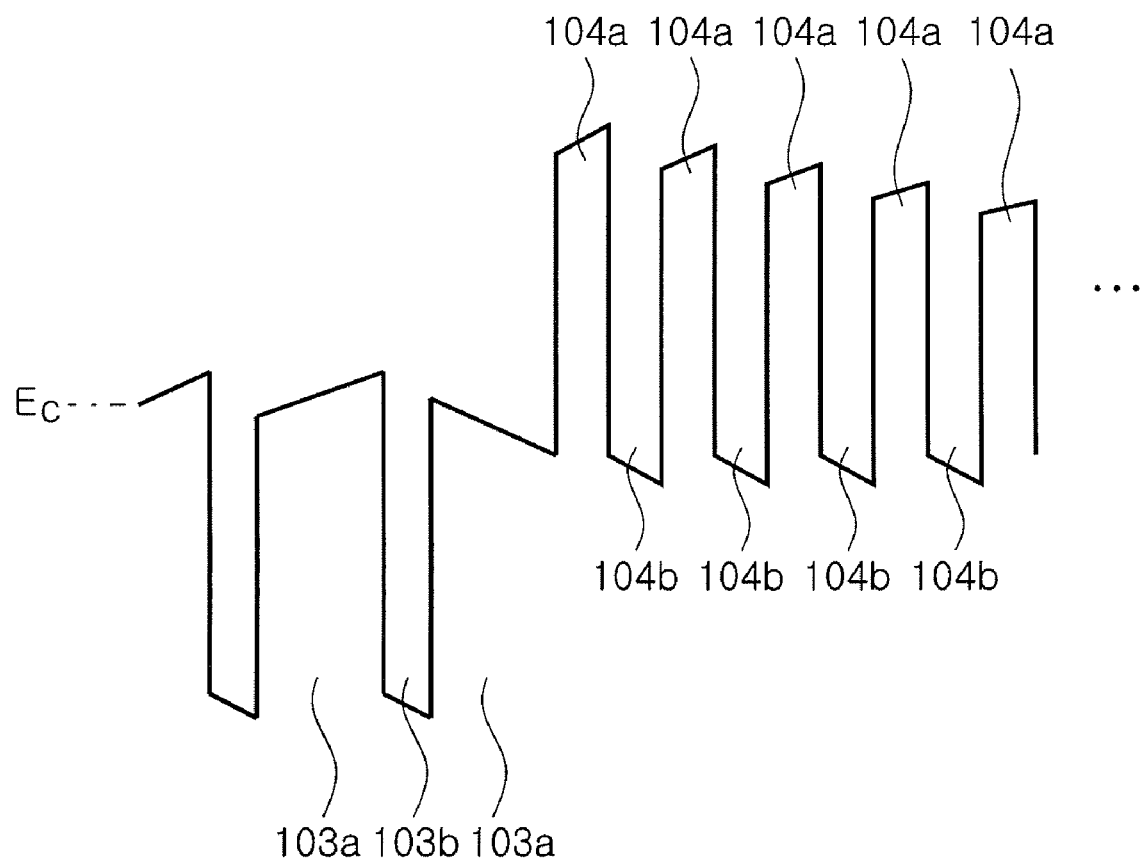
FIG. 6 is a schematic view illustrating conduction band energy levels in a nitride semiconductor device according to a modification of the embodiment illustrated in FIGS. 2 through 4.

However, the invention is not limited to this embodiment. As shown in FIG. 6, the energy levels of the first nitride layers 104a may be gradually reduced toward the p-type nitride semiconductor layer 105 along with a gradual decrease in inclination. This structure can be obtained by determining the composition so that the band gap energy of the first nitride layer 104a are reduced with reference to the graph in FIG. 5. Alternatively, the first nitride layer 104a may be formed of a triad element. That is, while the first nitride layers 104a are formed of AlGaN, the first nitride layers 104a are grown so that the aluminum content of the first nitride layers 104a is gradually reduced toward the p-type nitride semiconductor layer 105.

Figure 7:
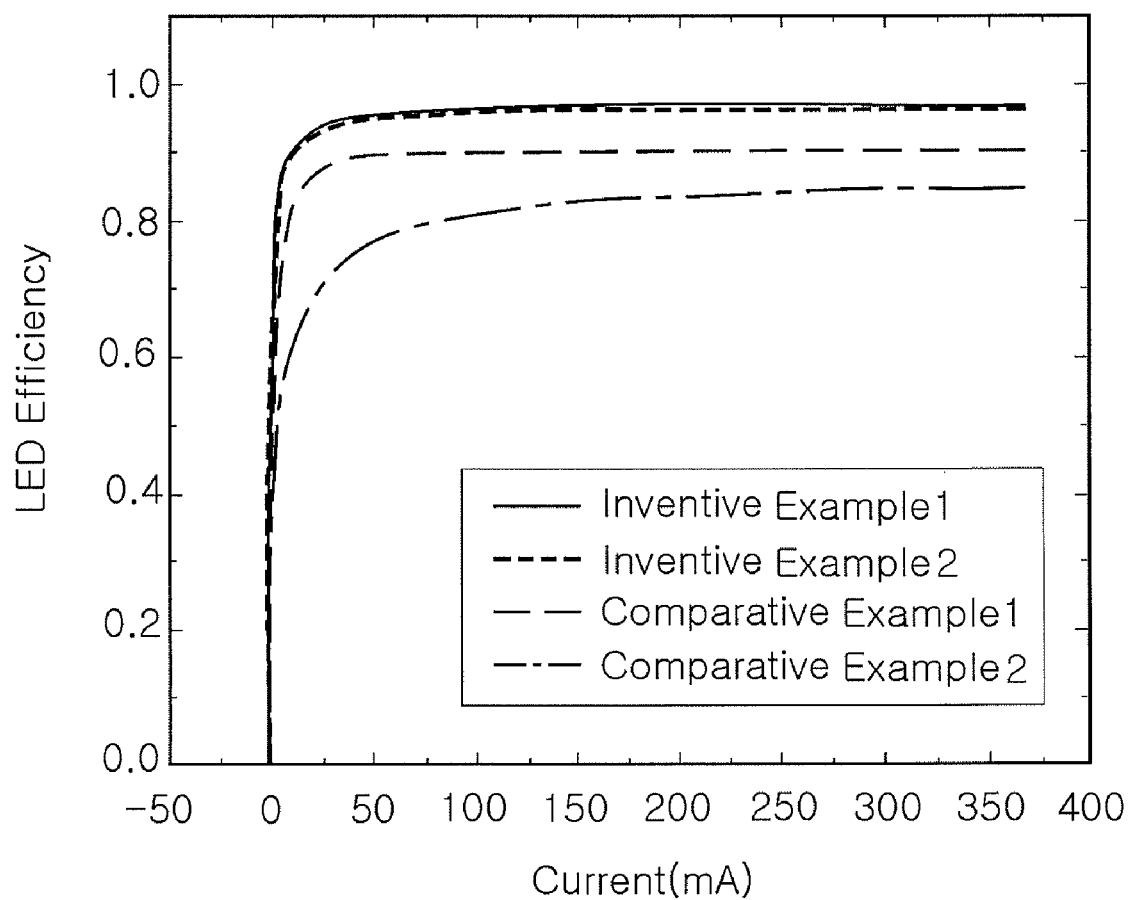
FIGS. 7 and 8 are graphs illustrating simulation results showing luminous efficiency and a driving voltage according to a current change in a nitride semiconductor device according to an exemplary embodiment of the present invention.
Figure 8:
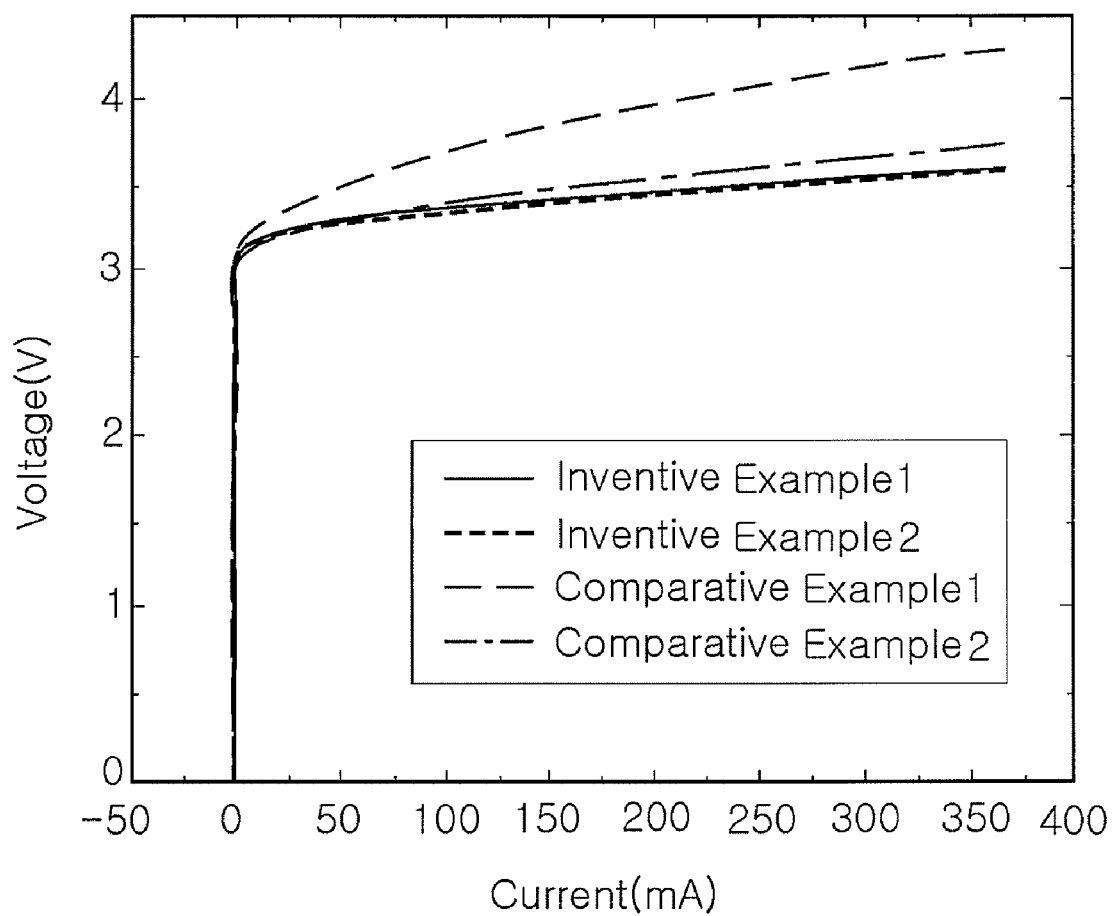

FIGS. 7 and 8 are graphs illustrating simulation results showing luminous efficiency and a driving voltage according to a current change in a nitride semiconductor light emitting device according to an exemplary embodiment of the invention. Here, Inventive Example 1 and Inventive Example 2 have structures according to the embodiments illustrated in FIG. 4 and FIG. 6, respectively. Comparative Example 1 is an electron blocking layer having an AlGaN/GaN super lattice structure having the aluminum content of 23%. Comparative Example 2 is an AlGaN/GaN super lattice structure having the aluminum content of 19% and having a band gap energy lower than Comparative Example 1. As shown in FIGS. 7 and 8, the electron blocking layers according to the exemplary embodiments of the invention may have improved luminous efficiency and a reduced luminous efficiency as compared with the electron blocking layer having the super lattice structure in the related art. This can be understood that the influence caused by the polarization can be reduced and the electron blocking efficiency can be increased by gradually reducing the inclinations of the energy levels.

Figure 9:
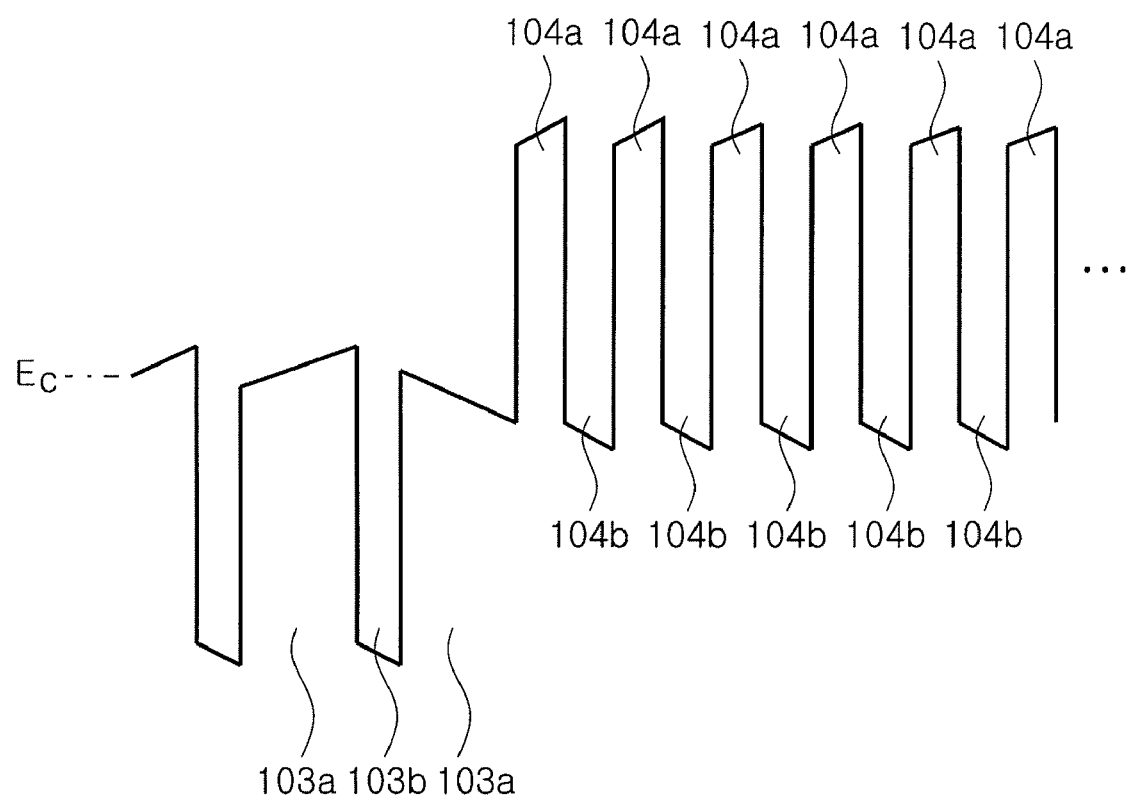
FIGS. 9 through 11 are schematic view illustrating conduction band energy levels of an electron blocking layer of a nitride semiconductor device according to another exemplary embodiment of the present invention.
Figure 10:
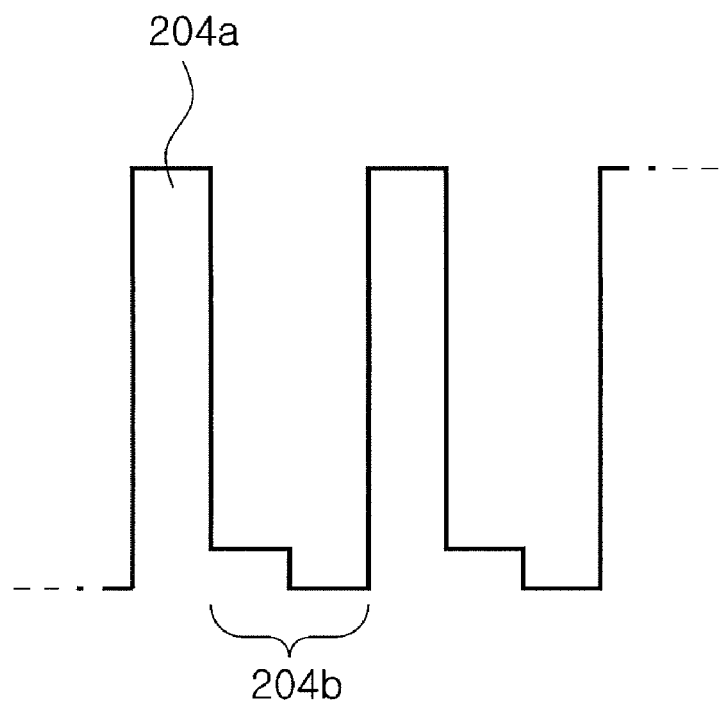
Figure 11:
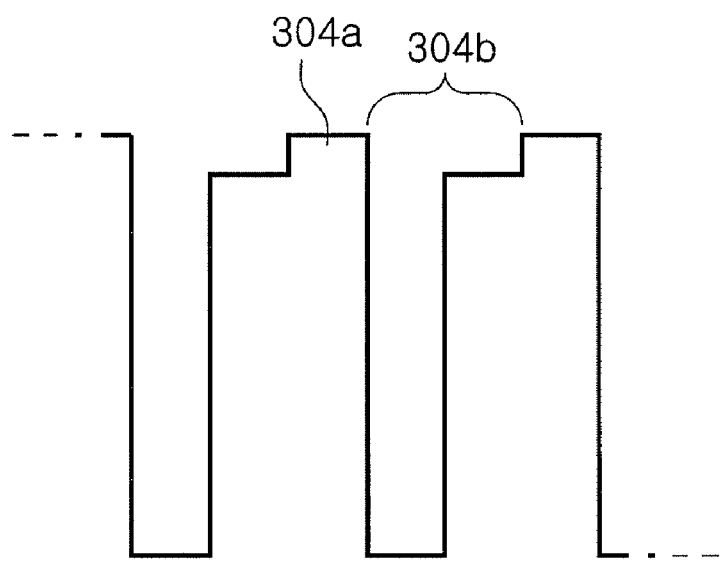

Meanwhile, the electron blocking layer in this embodiment can be varied while maintaining the structure according to the exemplary embodiments of the invention. FIGS. 9 through 11 are schematic views illustrating conduction band energy levels of an electron blocking layer of a nitride semiconductor light emitting device according to another exemplary embodiment of the invention. First, as shown in FIG. 9, a plurality of first nitride semiconductor layers 104a having the same inclination of the energy level may be arranged adjacent to each other. The electron blocking layer having this structure can increase the electron blocking efficiency.

Then, like structures illustrated in FIGS. 10 and 11 (where inclination of energy level is not shown), energy levels of second nitride layers 204b and 304b are stepped to reduce lattice mismatch between the second nitride layers 204b and 304b and first nitride layers 204a and 304a, respectively. The structure, shown in FIG. 10, can be obtained by repetitively growing AlInGaN/GaN/InGaN. The structure, shown in FIG. 11, can be obtained by repetitively growing AlInGaN/GaN/AlInGaN (the composition of AlInGaN contained in the first nitride layer is different from that in the second nitride layer).

As set forth above, according to exemplary embodiments of the invention, there is provided a nitride semiconductor device that can increase luminous efficiency and reduce an operating voltage by reducing the influence caused by polarization by minimizing the entire difference in energy level of the electron blocking layer.

While the present invention has been shown and described in connection with the exemplary embodiments, it will be apparent to those skilled in the art that modifications and variations can be made without departing from the spirit and scope of the invention as defined by the appended claims.

What is claimed is:

1. A nitride semiconductor device comprising:
   an n-type nitride semiconductor layer;
   a p-type nitride semiconductor layer;
   an active layer provided between the n-type and p-type nitride semiconductor layers and having quantum well layers and quantum barrier layers alternately stacked on each other; and
   an electron blocking layer provided between the active layer and the p-type nitride semiconductor layer, and having a plurality of first nitride layers formed of a material having a higher band gap energy than the quantum barrier layers and a plurality of second nitride layers formed of a material having a lower band gap energy than the first nitride layers, the first and second nitride layers alternately stacked on each other to form a stacked structure,
   wherein the plurality of first nitride layers have energy levels bent at predetermined inclinations, and with greater proximity to the p-type nitride semiconductor layer, the first nitride layers have a smaller inclination of the energy level.

2. The nitride semiconductor device of claim 1, wherein the plurality of first nitride layers have the same band gap energy.

3. The nitride semiconductor device of claim 2, wherein with greater proximity to the p-type nitride semiconductor layer, the plurality of first nitride layers have a smaller difference in net polarization charge amount from the corresponding second nitride layers adjacent thereto, respectively.

4. The nitride semiconductor device of claim 3, wherein the plurality of first nitride layers comprise a composition expressed by $Al_xIn_yGa_{(1-x-y)}N$ (where $0 \leq x \leq 1$, $0 \leq y \leq 1$, and $0 \leq x+y \leq 1$).

5. The nitride semiconductor device of claim 4, wherein with greater proximity to the p-type nitride semiconductor layer, the plurality of first nitride layers have a higher aluminum and indium content.

6. The nitride semiconductor device of claim 1, wherein with greater proximity to the p-type nitride semiconductor layer, the first nitride layers have a greater energy level on the basis of a conduction band.

7. The nitride semiconductor device of claim 1, wherein with greater proximity to the p-type nitride semiconductor layer, the plurality of first nitride layers have a lower energy level.

8. The nitride semiconductor device of claim 7, wherein with greater proximity to the p-type nitride semiconductor layer, the plurality of first nitride layers have a smaller difference in net polarization charge amount from the corresponding second nitride layers adjacent thereto, respectively.

9. The nitride semiconductor device of claim 1, wherein the second nitride layers have the same band gap energy as the quantum barrier layers.

10. The nitride semiconductor device of claim 1, wherein the stacked structure having the first and second nitride layers alternately stacked on each other is a super lattice structure.

11. The nitride semiconductor device of claim 1, wherein each of the second nitride layers comprises at least two different areas varying in energy level.

12. The nitride semiconductor device of claim 1, wherein at least two of the plurality of first nitride layers comprise the same inclination of the energy level, and the first nitride layers having the same inclination of the energy level are arranged adjacent to each other.

* * * * *